United States Patent [19]
Wada et al.

[11] Patent Number: 5,424,978
[45] Date of Patent: Jun. 13, 1995

[54] NON-VOLATILE SEMICONDUCTOR MEMORY CELL CAPABLE OF STORING MORE THAN TWO DIFFERENT DATA AND METHOD OF USING THE SAME

[75] Inventors: Toshio Wada; Kenji Anzai; Shoichi Iwasa; Yasuo Sato; Yuichi Egawa, all of Tokyo, Japan

[73] Assignee: Nippon Steel Corporation, Tokyo, Japan

[21] Appl. No.: 212,737

[22] Filed: Mar. 14, 1994

Related U.S. Application Data

[63] Continuation-in-part of Ser. No. 161,508, Dec. 6, 1993.

[30] Foreign Application Priority Data

Mar. 15, 1993 [JP] Japan .................. 5-080068

[51] Int. Cl.⁶ ............................ G11C 11/34
[52] U.S. Cl. ....................... 365/184; 365/185; 365/218; 365/168
[58] Field of Search ............. 365/184, 185, 218, 168

[56] References Cited

U.S. PATENT DOCUMENTS

| | | | |
|---|---|---|---|
| 5,218,569 | 6/1993 | Banks | 365/185 |
| 5,293,560 | 3/1994 | Harari | 365/218 |
| 5,309,391 | 5/1994 | Pappaliolios | 365/218 |

OTHER PUBLICATIONS

The Proposal of Multi-bit Type Flash Memory, Wada et al., The 53rd Autumn Meeting, 1992, The Japan Society of Applied Physics, 17a-ZS-9.

*Primary Examiner*—Joseph A. Popek
*Assistant Examiner*—F. Niranjan
*Attorney, Agent, or Firm*—Pollock, Vande Sande & Priddy

[57] ABSTRACT

A non-volatile semiconductor memory device capable of selectively storing one of at least three different data comprises a memory array including a plurality of memory cells, each having a control gate, a floating gate, a drain, and a source, a circuit for producing a stepped voltage whose level is varied stepwise to a number of different levels corresponding to a number of data to be stored, a circuit for producing a pulse voltage having a predetermined voltage level and a predetermined pulse width, and a circuit for selecting one of the plurality of memory cells, wherein during storing of the at least three different data the stepped voltage and the pulse voltage are applied to the control gate and the drain of the selected memory cell, respectively, while a timing of application of the pulse voltage to the drain is controlled relative to a timing of application of the stepped voltage to the control gate, depending on which of the at least three different data is to be stored into the selected memory cell.

13 Claims, 6 Drawing Sheets

FIG.6(a) WORD LINE

FIG.6(b) BIT LINE

NON-VOLATILE SEMICONDUCTOR MEMORY CELL CAPABLE OF STORING MORE THAN TWO DIFFERENT DATA AND METHOD OF USING THE SAME

CROSS-REFERENCE TO RELATED APPLICATIONS

This application is a continuation-in-part of U.S. patent application Ser. No. 08/161,508 filed on Dec. 6, 1993.

BACKGROUND OF THE INVENTION

1. Field of the Invention

The present invention relates to a nonvolatile semiconductor memory device capable of electrically writing information therein, and a method of using the same, namely a method of writing data into this memory device, or reading data from the memory device. More specifically, the present invention concerns a non-volatile semiconductor memory device capable of selectively writing any one of more than two values into each memory cell, and also a method of writing, or reading data into, or from this memory device.

2. Description of the Related Art

As one sort of non-volatile semiconductor memory devices, there is an EPROM (Erasable and Programmable Read-Only Memory). In this EPROM, data stored therein is erasable by irradiating ultraviolet ray to the EPROM, and also new data is electrically writable therein.

Each of memory Cells of this EPROM employs a MOS transistor including a drain region and a source region, which are fabricated on one surface of a substrate and are mutually separated from each other, and a channel region formed therebetween. The MOS transistor further includes a tunnel insulating film, a floating gate electrode, an interlayer insulating film, and a control electrode, which are successively formed on this channel region.

To write data into such a memory cell, electron charges are injected via the tunnel insulating film into the floating gate, thereby causing the memory cell to assume a first state indicating, for instance, data "1" where a threshold voltage of the memory cell is set to a high value, and conversely, data "0" is represented by a second state of the memory cell where the threshold voltage of the memory cell is set to a low value by removing the electron charges from the floating gate. This stored data is read out by sensing whether the memory cell is set into the first state, or the second state, by applying a voltage lower than the above-explained higher threshold voltage value and higher than the lower threshold voltage value to the control gate electrode.

The above-described conventional EPROM can store only data having two different values, since the respective memory cells are selectively set to one of the first and second state, resulting in a small memory capacity. To allow for a recent trend of increasing data amounts, it is desired to develop such an EPROM having a large memory capacity with a small number of memory cells.

To this end, the inventors have proposed a method of selectively writing 4-value data into each of the memory cells of EPROM in "The Proposal of Multi-bit type Flash Memory", at the 53rd Autumn Meeting, 1992, The Japan Society of Applied Physics, 17a-ZS-9. However, this proposal merely described the very basic idea. Thus, there are many difficulties to practically realize this type of flash memory.

SUMMARY OF THE INVENTION

A primary object of the present invention is to provide a non-volatile semiconductor memory device capable of having a storage capacity larger than that of the conventional non-volatile semiconductor memory device, even with the same number of memory cells as those of the conventional memory device, by selectively writing any one of more than two values into the respective memory cells.

Another object of the present invention is to provide a method of writing data into the above-described non-volatile semiconductor memory device, or of reading out data from this memory device.

A non-volatile semiconductor memory device, according to the present invention, capable of selectively storing therein one of at least three different data, comprises: a memory array including a plurality of memory cells, each of the memory cells having a control gate, a floating gate, a drain, and a source; means for producing a stepped voltage whose level is varied in a stepped form, the number of the varied levels corresponding to the number of data to be stored; means for producing a pulse voltage having a predetermined voltage level and a predetermined pulse width shorter than a duration time of the stepped voltage; means for selecting one of the plural memory cells; and means for controlling a relative application timing of the pulse voltage to the drain with respect to an application timing of the stepped voltage to the control gate by determining which data among the at least three different data should be stored into the selected memory cell, while both, the stepped voltage and the pulse voltage are applied to the control gate and the drain of the selected memory cell, respectively.

According to the present invention, a method of selectively writing one of at least three different data into a non-volatile semiconductor memory device equipped with a memory array including a plurality of memory cells, each memory cell having a control gate, a floating gate, a drain, and a source, comprises the steps of: selecting one of the plural memory cells; producing a stepped voltage whose level is varied in a stepped form, the number of the varied levels corresponding to the number of different data, and applying the stepped voltage to a gate electrode of the selected memory cell; producing a pulse voltage having a predetermined voltage level and a predetermined pulse width shorter than a duration time of the stepped voltage, and applying the pulse voltage to a drain of the selected memory cell; and controlling a relative timing of application the pulse voltage to the drain with respect to timing of application of the stepped voltage to the control gate by determining which data among the at least three different data should be stored into the selected memory cell.

According to the present invention, a method of reading one of at least three different data written into a non-volatile semiconductor memory device equipped with a memory array including a plurality of memory cells, each memory cell having a control gate, a floating gate, a drain, and a source, comprises the steps of: selecting one of the plural memory cells to be read; producing a stepped voltage whose level is varied in a stepped form, the number of the varied levels corresponding to the number of different data, and applying the stepped voltage to a gate electrode of the selected memory cell; producing a pulse voltage having a constant voltage and a pulse width shorter than a duration time of the stepped voltage, and applying the pulse voltage to a drain of the selected memory cell; and detecting a drain-to-source current of the selected memory cell at the respective levels of the stepped voltage applied to a control gate of the selected memory cell.

DESCRIPTION OF THE PREFERRED EMBODIMENTS

Referring now to the accompanying drawings, various embodiments of the present invention will be described. First, a basic idea of writing data into each memory cell of an EPROM will now be explained with reference to FIG. 1 that shows a circuit portion of this EPROM.

Figure 1:
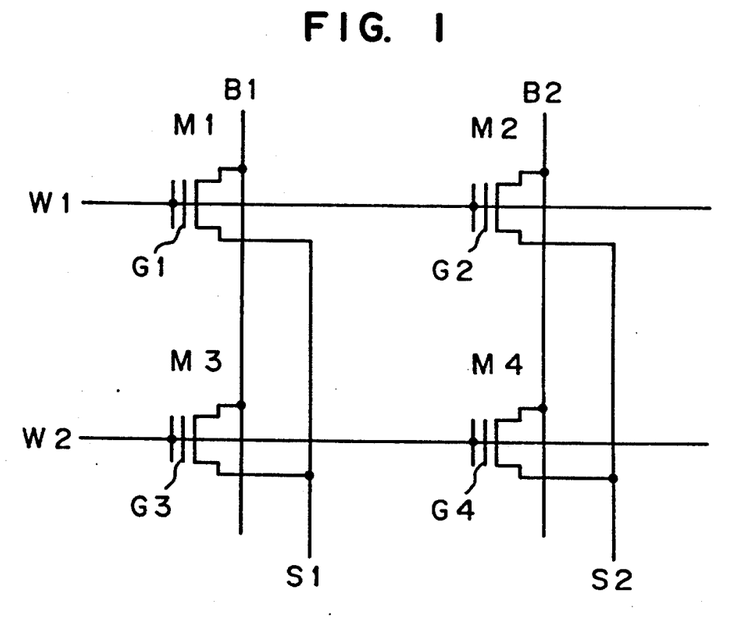
FIG. 1 shows a diagram for explaining a method of writing data into memory cells of an EPROM.

Each of memory cells M1 to M4 has floating gates G1 to G4 with no electrodes, respectively. Then, a word line W1 is connected to the respective control gates of the memory cells M1 and M2, and a word line W2 is connected to the respective control gates of the memory cells M3 and M4. It should be understood that actually, each word line and the respective control gates are constructed in an integral layer by using, for instance, polysilicon, and the word line per se constitutes control gates of the respective memory cells in the respective memory cell areas. On the other hand, a bit line B1 is connected to drains of the respective memory cells M1 and M3, and a bit line B2 is connected to drains of the respective memory cells M2 and M4. Furthermore, sources of the respective memory cells M1 and M3 are connected to a source line S1, and sources of the respective memory cells M2 and M4 are connected to a source line S2.

In an EPROM constructed as above, when a writing operation is executed to, for instance, the memory cell M1, a potential at the word line W1 is selected to be, for example, 12 V, and potentials at other word lines are set to 0 V. A potential of the bit line B1 is selected to be, for example, 5 V, and also potentials of other bit lines are set to 0 V, and furthermore potentials of all source lines are set to 0 V.

Assuming now that the coupling ratio of the control gate to the floating gate in each of the memory cells is 0.6, a potential of approximately 7 V is induced at the floating gate G1 of the memory cell M1. Then, as a result, a channel is formed between the drain and the source of the memory cell M1, and electrons with high energy (hot electrons) are produced near the drain due to the high gate voltage and the high drain voltage, and the hot electrons jump the potential barrier (in case of electrons, for example, 3.2 eV) between the silicon substrate and the gate oxide film and then are injected into the floating gate G1.

Since the floating gate G1 is surrounded by the oxide film having a very low conductivity, thus injected electrons semipermanently remain at this floating gate even after applications of the voltages of the word line W1 and the bit line B1 have been ceased, thereby maintaining a storage condition. This storage condition is assumed as, for instance, data "0". On the other hand, in the memory cell connected to the word line and the bit line, to which no voltage is applied, electrons are not injected into the floating gate thereof, so that the storage condition becomes, for example, data "1".

Then, when data is read out from this memory cell M1, the potential of the word line W1 is set to, for example, 5 V, and also the potentials of other word lines are set to 0 V. The potential of the bit line B1 is selected to be, for example, 1 V, and also the potentials of other bit lines are set to 0 V, and furthermore, the potentials of all source lines are set to 0 V.

As a result, if the storage stage of the memory cell M1 is "0" and the threshold voltage thereof is high (for example, 6 to 8 V), no current flows through the drain-to-source path of the memory cell M1. However, if the storage state is "1" and the threshold voltage is low (for instance, 2 to 3 V), a current flows through the drain-to-source path of the memory cell M1. This current flowing between the drain and the source is compared with a current value of a reference cell (which will be discussed later) to detect the storage condition of the memory cell M1.

In the conventional EPROM, since the threshold voltage of the memory cell is set to only a voltage higher or lower than a predetermined voltage level, only two binary data such as "0" and "1" can be stored in the memory cell. In accordance with the present invention, this threshold voltage of the memory cell is set to any one of at least three different levels, so that at least three different values may be stored into the memory cell.

Next, as a first embodiment of the present invention, a description will now be made of a method of selectively writing four binary data [00] to [11] into the respective memory cells M1 to M4 of the above-explained EPROM.

First, four levels of 2 V, 3 V, 4 V and 5 V are determined as threshold voltages of the respective memory cells corresponding to these four data.

For example, when data [11] is written into the memory M1, a high voltage in a range of 12 V to 15 V is applied to the word line W1, and other word lines are under floating condition, or coupled to the ground potential. Then, the bit line B1 is grounded, and each of the other bit lines is biased at 3 V. At this time, the source lines S1 and S2 are opened, thereby being rendered to a floating state. As a consequence, a voltage of 12 V to 15 V is applied to the control gate electrode of the memory cell M1, and also the voltage of the drain electrode is set to zero volt. Then, the source electrode is brought into the floating state. Electron charges are injected at an amount corresponding to a potential difference between the control gate electrode and the drain electrode into the floating gate, and the threshold voltage of the memory cell M1 is set to 5 V.

Figure 2:
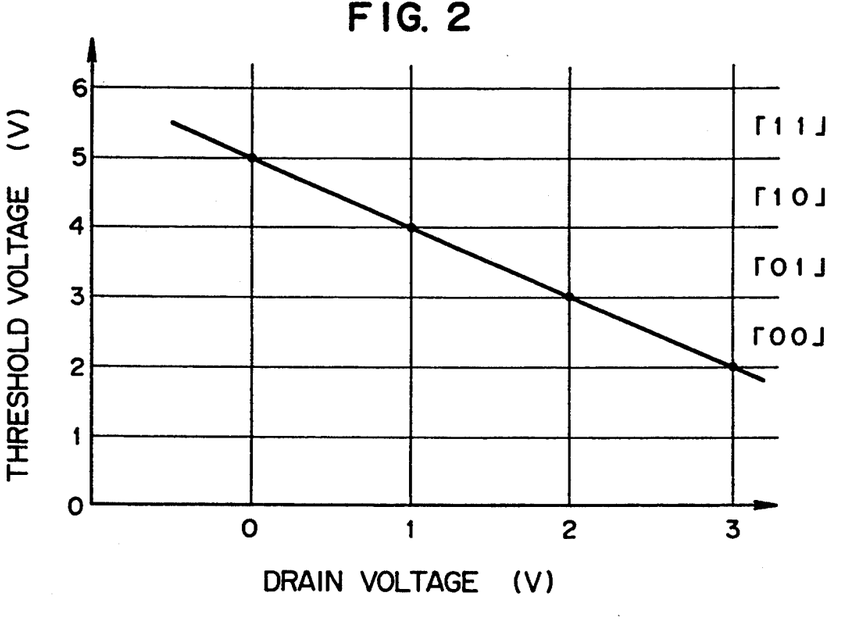
FIG. 2 is a graphic representation showing a relationship between a voltage to be applied to a drain electrode and a threshold voltage of a memory cell when data is written into each memory cell according to a first embodiment of the present invention.

Subsequently, when the data [10] is written into the memory cell M1, both the word line W1 and the source line S1 are brought into the same conditions as the above case, and a pulse voltage of a potential of 1 V is applied to the bit line B1, namely the drain. As a consequence, the threshold voltage of the memory cell M1 is set to 4 V. Similarly, the threshold voltage is set to 3 V (data [01]) by setting the drain voltage at 2 V and the threshold voltage is set to 2 V (data [00]) by setting the drain voltage at 3 V. A relationship between the drain voltage and the threshold voltage of the memory cell in this embodiment is shown in FIG. 2. As seen from this drawing, in accordance with the present embodiment, the threshold voltage of the memory cell can be set to any of four states of 2 V, 3 V, 4 V and 5 V in correspondence with the levels of the drain voltages. Any of four data of [00] to [11] can be stored in this way by representing these data by the respective threshold voltages. Similarly, four data can be selectively stored into each of the memory cells M2 to M4.

When the data thus written into the selected memory cell is to be read out, which one of data [00] to [11] is stored in the selected one of the memory cells M1 to M2 is detected by applying, for example, 5 V to the word line W1 and comparing the drain current of each of reference cells whose threshold voltages are preliminarily set to respective levels with the drain current of the selected memory cell.

It will be understood that although the threshold voltage of each memory cell is set selectively to four different voltages in the above-explained embodiment, more data may be stored by dividing the threshold voltage into more levels. Also, in the above-described embodiment, the threshold voltage of each memory cell is changed by changing the drain voltage, namely its pulse height. Alternatively, as disclosed in, for instance, Japanese Patent Application No. 5-239135 filed on Aug. 31, 1993 corresponding to U.S. patent application Ser. No. 08/112,997 filed on Aug. 30, 1993, the threshold voltage of each memory cell may be varied by changing total application time of the pulse voltage, namely the pulse width. Furthermore, it should be noted that the relationship between the gate voltage or the drain voltage and the threshold voltage of each memory cell, as mentioned in this embodiment, may be changed depending on the structure of memory cell, the thickness of interlayer insulating film, the thickness of the tunnel insulating film and so on.

Figure 3:
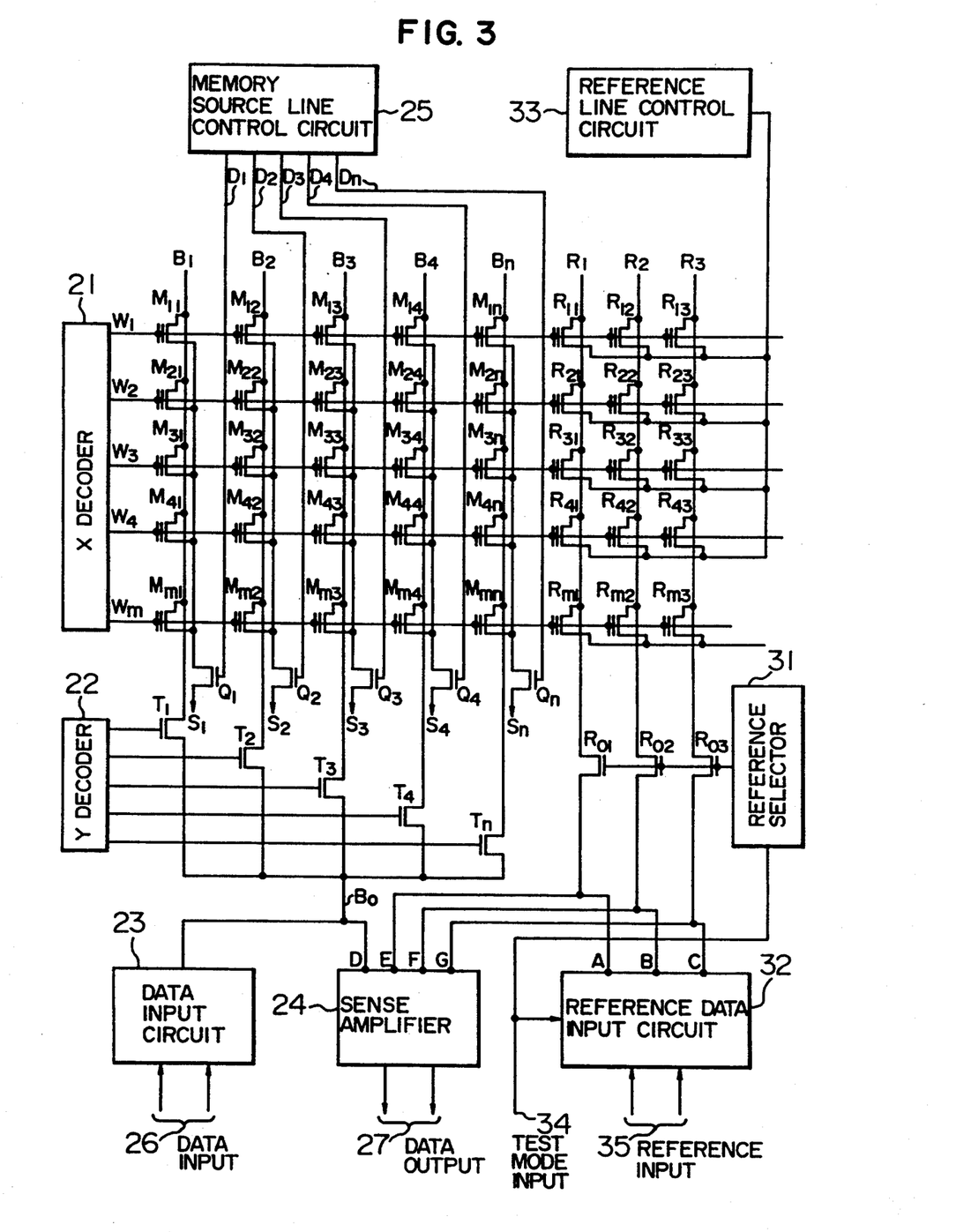
FIG. 3 schematically represents an arrangement of a major portion of an EPROM to which the method of the present invention is applied.

FIG. 3 is a circuit diagram of an EPROM to which the present invention is applied. Memory cells M11, M12, ..., Mmn are connected in a matrix of columns and rows. Drains of memory cells $M_{1i}$, $M_{2i}$, ..., Mmi (i=1, ..., n) of each column are connected to a bit line Bi, control gates of memory cells $M_{j1}$, $M_{j2}$, ..., Mjn (j=1, ..., m) of each row are connected to a word line Wj. In the embodiment, cut-off MOS transistors Q1 to Qn are provided to respective source lines S1 to Sn for cutting them off. Then, the source of a selected one of memory cells $M_{11}$–$M_{mn}$, into which data is to be written, can be brought to the floating condition by turning off the cut-off MOS transistor provided to the source line connected to the source of the selected memory cell by one of the control line D1 to Dn.

As a reference cell circuit, there is provided a circuit in which MOS transistor R11, R21, ..., Rm1, R12, R22, ..., Rm2, R13, R23, ..., Rm3, each having the same characteristic as that of the memory cell, are arranged in a matrix of three columns and m rows. Three reference cells of the same row as that of the selected memory cell are selected. The data written into the selected memory cell is judged by comparing the drain current of the selected memory cell with the drain currents of the selected reference cells in sequence. The operation of the circuit shown in FIG. 3 will be discussed later.

Next, a description will be made of a second embodiment of the present invention. Similarly to the first embodiment, four binary data [00] to [11] are, selectively written. However, voltages applied to the word line and the bit line are different from those in the first embodiment.

For instance, when the data [11] is written into the memory cell M1, the bit line B1 is grounded, the source line S1 is opened, and a pulse voltage of 10 to 15 V is applied to the word line W1. As a consequence, a voltage is induced on the floating gate G1 of the memory cell M1, and electron charges are injected into the floating gate G1 at a predetermined amount according to Fowler Nordheim tunnelling in correspondence with a potential difference between this floating gate G1 and the drain. Then, a threshold voltage of the memory cell M1 is increased to approximately 7 V. This state is assumed as "11". It should be noted that at this time, no Fowler-Nordheim tunnelling occurs in the memory cells other than the memory cell M1 by applying a voltage of approximately 3 V to the bit lines other than the bit line B1, and therefore no data writing into these memory cells is carried out.

Similarly, when the data "10" is written into the memory cell M1, a voltage of approximately 1 V is applied to the bit line B1, and others are set to the same as the above when "11" is written. As a consequence, the threshold value of memory cell M1 becomes about 5 V, and this condition is assumed as "10".

Furthermore, when the data "01" is written into the memory cell M1, a voltage of approximately 2 V is applied to the bit line. B1, and others are set to the same as the above. As a result, the threshold voltage of the memory cell M1 is set to about 3 V, and this condition is assumed as "01".

In addition, when the data "00" is written into the memory cell M1, a voltage of approximately 3 V is applied to the bit line B1, and others are set to the same as the above. In this case, the threshold voltage of the memory M1 is about 1 V, which is not substantially changed from the initial threshold value (erasing level). This condition is assumed as "00".

Figure 4:
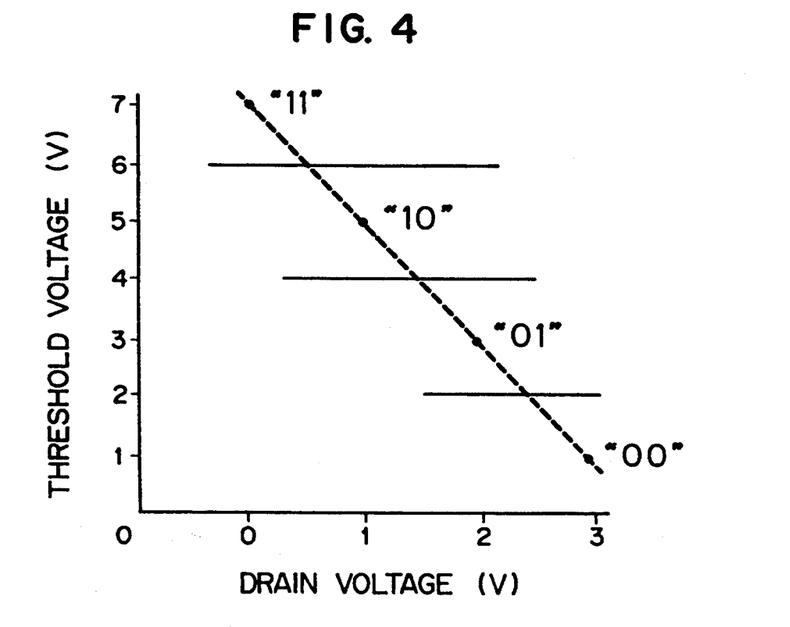
FIG. 4 is a graphic representation indicating a relationship between a voltage to be applied to a drain electrode and a threshold voltage of a memory cell when data is written into each memory cell, according to a second embodiment of the present invention.

A relationship between the voltage applied to the drain of the memory cell and the threshold voltage, according to this embodiment, is shown in FIG. 4.

In case of reading out of this memory cell M1, for example, a voltage of 1 V is applied to the bit line B1, and all of the potentials for the bit lines other than the bit line B1 are set to 0 V, and also all of the potentials of the source lines are set to 0 V. Then, under this condition, a voltage of 5 V is applied to the word line W1, and the reading operation is carried out by comparing a current flowing through the source-to-drain path with currents of the reference cells which are previously set to four conditions, respectively.

The storage contents of all memory cells are collectively erased at a time.

Next, a description will be made of a circuit of FIG. 3. As illustrated in this drawing, word lines W1, W2, .., Wm are connected to an X decoder 21 for selecting one of the word lines. On the other hand, bit lines B1, B2, ..., Bn are connected via transistors T1, T2, ..., Tn to a data input circuit 23 and a sense amplifier 24, respectively, and gates of the transistors T1, T2, ..., Tm are connected to an Y decoder 22 for selecting one of the bit lines. To select one of memory cells arranged in a matrix form, a predetermined voltage is applied by an X decoder 21 to the word line connected to the gate of the memory cell to be selected and word lines other than this word line are biased at the ground potential. A Y decoder 22 applies a predetermined voltage to the gate of the transistor connected to the selected bit line, thereby conducting this transistor and connecting this bit line to a data input circuit 23 and a sense amplifier 24. The transistors connected to other bit lines are held in non-conducting state.

The sources of the memory cells connected to the respective bit lines are grounded via the transistors Q1, Q2, ..., Qn, and the gates of the transistors Q1, Q2, .., Qn are connected via the respective control lines D1, D2, ..., Dn to a memory source control circuit 25. When data is written, the transistor connected to the source of the selected memory cell is brought into the non-conducting condition or the floating state. On the other hand, when data is read, all of the transistors are brought into the conducting state.

One of the data "00", "10", "01", and "11" to be written into the selected memory cell is supplied to a data input of a data input circuit 23. The data input circuit 23 produces a voltage corresponding to the supplied data, and applies this voltage via the corresponding bit line to the drain of the selected memory cell. As a consequence, the selected memory cell is set to a threshold voltage determined in correspondence with the inputted data.

Then, a description will be made of the reference cell circuit. The reference cell circuit is to set reference currents which are sequentially compared with a drain current of a selected memory cell when data written into this memory cell is read. To the end, the threshold voltage of each reference cell is set to a value determined depending on the threshold voltage at which each memory cell is set selectively. For example, as in the second embodiment, when the threshold voltage of the memory cell is set to one of 1 V, 3 V, 5 V and 7 V in correspondence with the input data, the threshold voltages of the respective reference cells are set as follows.

First, for instance, a selection signal "1" is externally supplied to a test mode input 34, so that both a reference data input circuit 32 and a reference selector 31 are activated. The reference selector 31 produces a gate voltage of, for example, 15 V, so that transistors R01, R02, R03 become conductive. On the other hand, the sources of the respective reference cells are brought into the floating condition by a reference source line control circuit 33. First, in order to set the threshold voltages of the reference cells R11, R12 and R13, the word line W1 is selected by the X decoder 21 and 15 V is outputted to the word line W1. Under this condition, a preselected signal, for example, "00" is inputted to a reference input 35. The voltages of 9 V, 7 V, 5 V produced from the output terminals A, B, C of the reference data input circuit 32, are applied via the transistors R01, R02, R03 and the bit lines R1, R2, R3 to the drains of the selected memory cells R11, R12, R13, whereby the threshold voltages of these memory cells are set to 2 V, 4 V, 6 V, respectively. Similarly, the word lines W2, W3, ..., Wm are sequentially selected, and the above-described process is repeated, so that the threshold voltage of each of the memory cells connected to the bit line B1 is set to 2 V, the threshold voltage of each of the memory cells connected to the bit line B2 is set to 4 V, and the threshold voltage of each of the memory cells connected to the bit line B3 is set to 6 V.

When data is read out from a memory cell, the transistors Q1, Q2, ..., Qn are rendered conductive by a memory source line control circuit 25, whereby the sources of the respective memory cells are brought into the ground condition. Also, the respective sources of the reference cells are brought into the ground state by a reference source line control circuit 33. Subsequently, a selection is made of the word line and the bit line connected to the memory cell to be read out by the X decoder 21 and the Y decoder 22. In the case that, for instance, the memory cell M11 is to be read, the word line W1 and the bit line B1 are selected, 6 V is applied to the word line W1, and 0 V is applied to other word lines. Also, the transistor T1 connected to the bit line B1 is made conductive, and the transistors connected to other bit lines are made non-conductive. At the same time, both the sense amplifier 24 and the reference selector 31 are activated, and a voltage of 1 V is derived from each of the output terminals D, E, F and G of the sense amplifier 24. In response to the outputs from the reference selector 31, the transistors R01, R02, R03 become conductive. As a result, a current "I0" corresponding to the threshold voltage set to the selected memory cell M11 flows from the output terminal D of the sense amplifier 24 via the line B0 and a drain-to-source circuit of the memory cell M11. On the other hand, currents I1, I2, I3 corresponding to the threshold voltages set to the respective reference cells flow from the output terminals E, F, G via the transistors R01, R02, R03, and the drain-to-source circuits of the reference cells R11, R12, R13, respectively. The sense amplifier is a differential amplifier which compares the current I0 with the currents I1, I2, I3, successively. When the threshold voltage of the memory cell M11 is set to 7 V, the current I0 is higher than any of the currents I3, I2, I1. When the threshold voltage of the memory cell M11 is set to 5 V, the current I0 is lower than the current I3 and higher than the current I2. When the threshold voltage of the memory cell M11 is set to 3 V, the current I0 is lower than any of the currents I3 and I2, and higher than the current I1. When the threshold voltage of the memory cell M11 is set to 1 V, the current I0 is lower than any of the currents I3, I2, I1. Thus, the level of the threshold voltage set to the memory cell can be judged by sequentially comparing the current I0 with the currents I1, I2, I3. The sense amplifier 24 outputs one of the data "00", "10" "01" and "11" corresponding to the threshold voltage set to the memory cell M11, to the data output 27.

As previously explained, according to the method of this embodiment, 4-value data of "00" to "11" can be stored into the unit memory cell, and also can be read out. As a consequence, when the number of memory cells is the same as that of the conventional memory cells, the amount of information twice as that of the conventional memory cells can be stored.

It should be noted that when using threshold voltages corresponding to those obtained by equally subdividing between a highest threshold voltage level and a lowest threshold voltage level which can be set to each memory cell, as the number of subdivisions becomes larger, a larger number of different data can be stored in one memory cell. In this case, it is required to select the number of subdivisions so that the level difference between two closest threshold voltages is larger than an allowable minimum level difference with which no error occurs when judging the threshold voltage set to each memory cell by considering the variation of characteristics in production of the MOS transistor constituting each memory cell. This allowable minimum level difference is determined based on experimental study. Further, although specific voltage values are shown in the above embodiments, those voltage values may be changed depending on structure of the memory cell, and particularly, the thickness of the tunnel insulating film, that of the interlayer insulating film and so on.

Next, a third embodiment of the present invention will be explained with reference to FIGS. 5 and 6. Although four binary data of [00] to [11] are selectively written also in the third embodiment, voltages applied to word lines and bit lines are different from those of the first and second embodiment.

Figure 5:
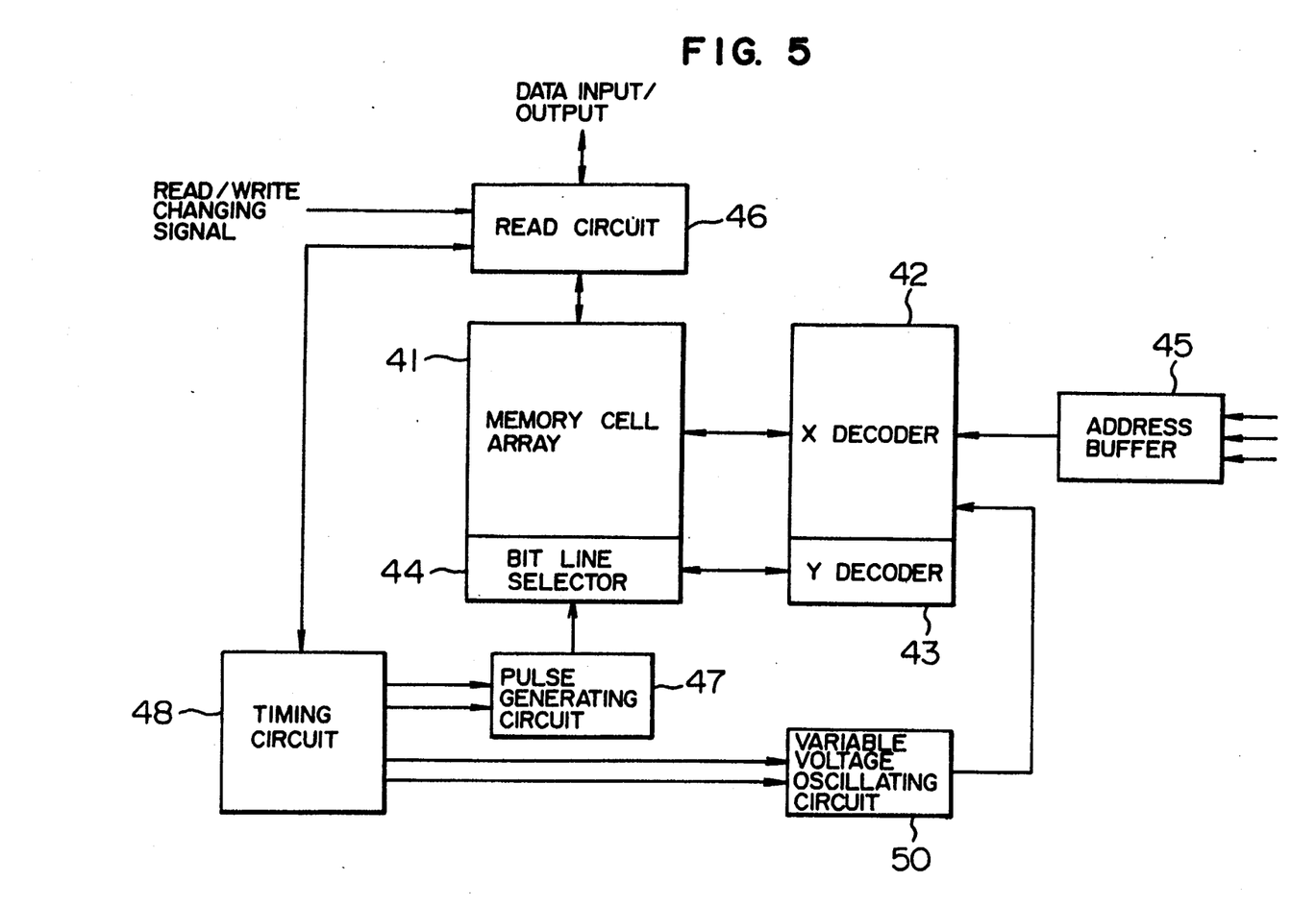
FIG. 5 is a block diagram for representing a circuit arrangement of a non-volatile semiconductor memory device according to a third embodiment of the present invention.
Figures 6A, 6B:
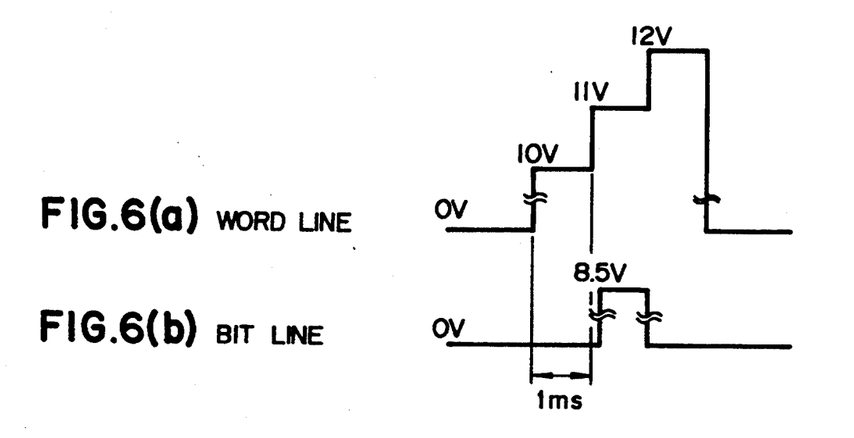
FIG. 6 shows waveforms of voltages applied to the word lines and the bit lines during the data writing operation according to the third embodiment.

In FIG. 5, there is shown a circuit arrangement of a major portion of an EPROM according to this embodiment. In FIG. 5, a memory cell array 41 has the same structures as that of the array including the memory cells M11, M12, ..., Mmn, which have been explained in FIG. 3. Word lines W1, W2, ..., Wm connected to control gates of the respective memory cells are connected to an X decoder 42. Bit lines B1, B2, ..., Bn connected to drains of the respective memory cell are connected via a bit line selector 44 to a Y decoder 43. The bit line selector 44 corresponds to the circuitry including the transistors T1, T2, ..., Tn of FIG. 3, and the Y decoder 43 is connected to the gates of the transistors T1, T2, ..., Tn.

For the sake of simple explanation, the memory array 41 includes 4 memory cells M1 to M4, as illustrated in FIG. 1. A description will now be made of such an operation when any one of four different data "00", "01", "10", and "11" is written into the EPROM of this embodiment with reference to FIGS. 5 and 6.

It is now assumed that the designated data is written into the memory cell M1 of FIG. 1. In the write mode, upon receipt of data to be written, the timing circuit 48 produces a trigger signal "A" in response to this data reception. In response to the trigger signal "A", a variable voltage generating circuit 50 built in a semiconductor chip for constituting the memory cell array, generates a stepped voltage whose level is stepwise changed to 0 V, 10 V, 11 V, and 12 V for every 1 ms, as indicated in FIG. 6. This stepped voltage is applied to the word line W1 selected by an X decoder 42, and all of potentials of other word lines are selected to be 0 V. The four levels of 0 V, 10 V, 11 V, and 12 V of the stepped voltage correspond to four data of "00", "01", "10", and "11".

On the other hand, the timing circuit 48 applies a trigger signal "C" to a pulse generating circuit 47 at a timing corresponding to the data inputted via a read circuit 46. In response to the trigger signal "C", the pulse generating circuit 47 generates, for instance, a pulse voltage of 8.5 V with a pulse width of 0.8 ms, and applies this pulse voltage to the bit line B1 selected by the Y decoder 43. That is, in case that the write data is "00", the above-described pulse voltage is applied to the bit line B1 at a timing when the level of the stepped voltage is 0 V. In case that the write data is "01", the pulse voltage is applied to the bit line B1 at another time when the level of the stepped voltage is 10 V. In case that the write data is "10", the pulse voltage is applied to the bit line B1 at another timing when the level of the stepped voltage is 11 V. Also, in case that the write data is "11", the pulse voltage is applied to the bit line B1 at a timing when the level of the stepped voltage is 12 V. The value of this pulse application time interval, namely the pulse width is selected in such a manner that the pulse application time does not exceed the shortest one of the duration times of the respective levels. Also, the time width of the pulse voltage applied to the bit line is not overlapped with two levels of the stepped voltage. As a result, in case that the voltage duration time of each level is 1 ms, the pulse width of the pulse voltage may be set to a proper value between 0.5 to 1 ms. All of potentials of the source lines are set to 0 V.

For example, when the data "10" is written, the pulse voltage is applied to the bit line B1 at a time when the level of the stepped voltage is 11 V. As a result, a channel is formed between the drain and source of the memory cell M1 and hot electrons produced near the drain are injected into the floating gate G1 while jumping over the potential barrier of the silicon gate oxide film, so that desired data is written. As a result, the threshold voltage of the memory cell M1 becomes approximately 4 V. It is assumed that this condition represents data "10".

Similarly, when a pulse voltage of 8.5 V is applied to the bit line B1 in conformity to such a timing when the voltage of 10 V is applied to the word line W1, the threshold voltage of the memory cell M1 becomes about 3 V. It is now assumed that this condition represents the data "01".

Furthermore, when the pulse voltage of 8.5 V is applied to the bit line B1 in conformity to a timing when the voltage of 12 V is applied to the word line W1, the threshold voltage of the memory cell M1 becomes approximately 5 V. It is now assumed that this state indicates the data "11".

Then, it is also assumed that such a condition under which no data is written into the memory cell M1 represents the data "00". Under this condition, the threshold voltage of the memory cell M1 is about 2 V.

As explained above, the programming method employs the channel hot electron injection method, while utilizing such a characteristic that the threshold voltage (Vth) after the programming operation is changed by the voltage ($V_{CG}$) applied to the control gate. FIG. 3 represents a temporal variation in the threshold voltage after the writing operation when the voltage applied to the control gate is varied. By applying the stepped voltage generated from the internal circuit to the selected word line, and controlling the application timing of the pulse to the bit line, four sorts of threshold voltages (Vth) can be selectively set after the programming operation. As described above, the set values of the threshold voltages to the memory cell are 2 V, 3 V, 4 V, and 5 V in correspondence with the data "00", "01", "10", and "11".

Next, a description will now be made of a reading operation for the EPROM according to this embodiment. As illustrated in FIG. 3, a reference array including reference cells R11, R12, ..., Rm3 is provided also in that embodiment, and data may be read out in a similar manner to that of FIG. 3. However, in this embodiment, the data stored in the memory cell may be read as follow, by utilizing the variable voltage generating circuit 50, the timing circuit 48, and the pulse generating circuit 47.

When data is read out from the memory cell M1, the timing circuit 48 is set to the read mode in response to a read/write changing signal externally supplied through the write/read circuit 46. On the other hand, in response to an address signal supplied to the address buffer 45, both the word line W1 and the bit line B1 are selected via the X decoder 42 and the Y decoder 43. In the read mode, the timing circuit 48 produces a trigger signal "B". In response to the trigger signal "B", the variable voltage generating circuit 50 generates a stepped voltage whose level changes stepwise so as to rise from 0 V to 2.5 V, 3.5 V and 4.5 V successively at every 1 ms, and applies the stepped voltage to the selected word line W1. On the other hand, in the read mode, the timing circuit 48 produces a trigger signal "D". In response to this trigger signal "D", the pulse generating circuit 47 generates a DC pulse signal having a constant voltage of 1 V, which is continued for at least a time period that is not shorter than the duration time of 4 ms for the above-described stepped voltage, and then applies this DC pulse signal to the selected bit line B1. At this time, the timings of application of both the stepped voltage and the DC signal to the control gate and the drain are controlled so that while the stepped voltage is being applied to the word line W1, the DC pulse signal of 1 V is continuously supplied to the bit line B1. The potentials of the remaining bit lines and all source lines are set to 0 V. The read circuit 46 checks whether or not the current flows through the drain-to-source circuit of the selected memory cell M1 for each of the levels of the stepped voltage, and then determines the data stored in the memory cell M1 based upon the check result.

In other words, it is now assumed that a case where the current flows through the drain-to-source circuit represents "1", whereas a case where no current flows through this circuit indicates "0". For instance, assuming now that a current flows through the drain-to-source circuit when the voltage of 2.5 V is being applied to the word line W1. In a case that a checking result of the drain-to-source current corresponding to the stepped voltage having the level of 2.5 V is represented as "1", the read circuit 46 judges that the data stored in the memory cell M1 is "00", and thus outputs "00".

In a case that no drain-to-source current flows when the voltage of 2.5 V is applied to the word line W1, but the current flows when the voltage of 3.5 V is applied thereto, namely a checking result of the drain-to-source current for the level of the stepped voltage of 3.5 V is represented as "1", the read circuit 46 judges that the data stored in the memory cell M1 corresponds to "01", thereby outputting "01". In another case that no drain-to-source current flows when the stepped voltage of 3.5 V is applied to the word line W1, but the current flows when the stepped voltage of 4.5 V is applied thereto, namely a checking result of the drain-to-source current is indicated by "1" for the level of the stepped voltage of 4.5 V, the read circuit judges that the data stored in the memory cell M1 corresponds to "10", and thus outputs "10". When no drain-to-source current flows even when the stepped voltage of 4.5 V is applied to the word line W1, a checking result of the drain-to-source current for the level of the stepped voltage of 4.5 V is denoted by "0", the read circuit judges that the data stored in the memory cell M1 corresponds to "11", and then output "11". In this case, the signals indicating the timings for the respective levels of the stepped voltage are supplied from the timing circuit 48, and the read circuit 46 judges the data stored in the memory cell M1 based upon the checking result of "1" or "0" for the drain-to-source current at this timing. That is, the read circuit 46 has a function of a two-value/four-value converting circuit by which the two-value signal representative of the checking result about the drain-to-source current is converted into any one of four data "00", "01", "10", and "11".

The embodiment have been described, in a case where the stepped voltage whose level is changed stepwise in four levels is applied to the selected control gate so as to write any one of the four different data. Generally speaking, in case of "m" (m being a positive integer, $m \geq 2$), a stepped voltage having m-staged levels is applied to a selected control gate. In particular, $2^n$ pieces of different data indicated by an n-bit binary number may be stored by employing such a stepped voltage whose level is varied stepwise in $2^n$ levels (n being a positive integer, $n \geq 2$).

As previously explained, four values of "00" to "11", namely 2-bit data can be stored in a single memory cell of the EPROM according to the third embodiment, and also can be read out from the memory cell.

It should be noted that to erase the storage condition, data stored in all of the memory cells are simultaneously erased by irradiating ultraviolet rays as well known in the art.

It should also be noted that although the concrete voltage values have been described in the above-mentioned embodiments, the voltage values may be changed to proper values, depending upon the structure of the memory cell, particular to the capacitance of the gate oxide film and the interlayer insulating film, and the coupling ratio of the gate oxide film to the interlayer insulating film.

Figure 7:
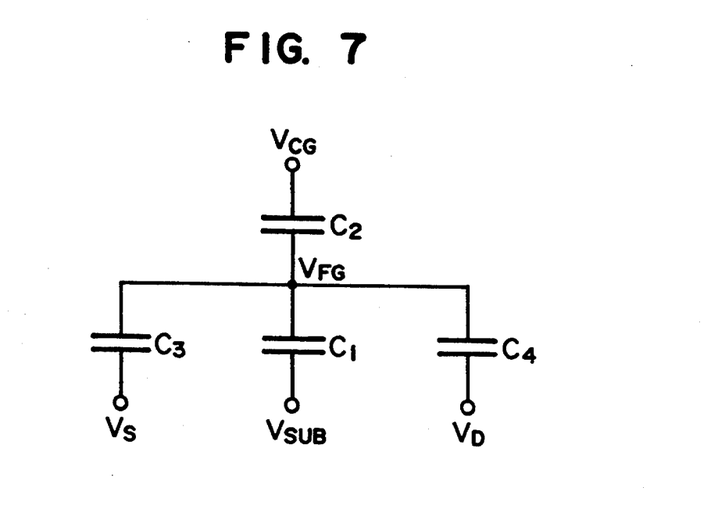
FIG. 7 indicates, an equivalent circuit of the memory cell of EPROM.
Figure 8:
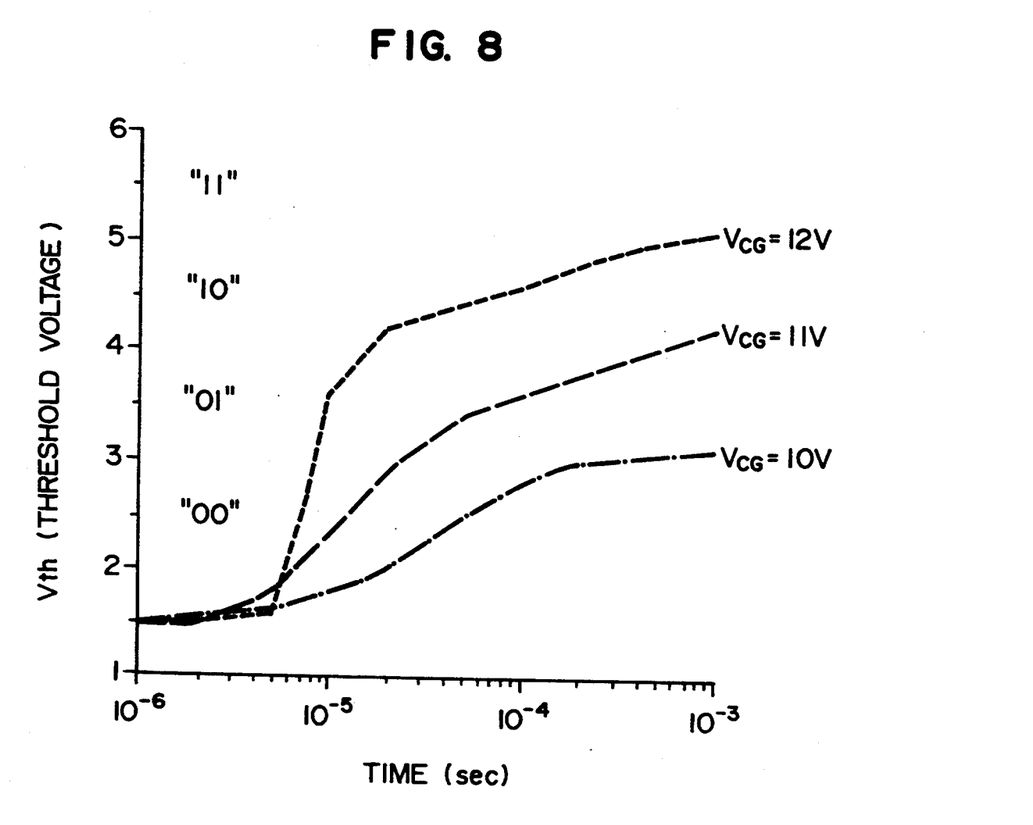
FIG. 8 is a graphic representation for showing temporal changes of the threshold voltage after the writing operation when the voltage to be applied to the control gate is varied.

Next, the change of the threshold voltage in writing operation depending on the voltage applied to a control gate will now be explained by use of an equivalent circuit of a memory cell shown in FIG. 7.

Assuming now that potentials of a control, gate, a floating gate, a drain, a source, and a substrate are respectively, "$V_{CG}$", "$V_{FG}$", "$V_D$", "$V_S$" and "$V_{SUB}$", whereas capacitances between the control gate and the floating gate, between the floating gate and the substrate, between the floating gate and the drain, and between the floating gate and the source are "$C_2$", "$C_1$", "$C_4$" and "$C_3$", respectively.

Then, assuming that an amount of electric charges accumulated in the floating gate is "Q", this amount "Q" is expressed as follows, in accordance with the conservation low of electron charges:

$$Q = C_2(V_{FG} - V_{CG}) + C_1(V_{FG} - V_{SUB}) + C_3(V_{FG} - V_S) + C_4(V_{FG} - V_D) \quad (1)$$

Here, it is now assumed: $V_S=V_{SUB}=0$, then it is given by:

$$V_{FG}=(C_2 \cdot V_{CG}+C_4 \cdot V_D+Q)/C_T \quad (2)$$

where, $$C_T=C_1+C_2+C_3+C_4$$

Then, when the threshold voltages of the transistor, as viewed from the control gate and the floating gate, are selected to be "$V_T$" and "$V_{FT}$", respectively, the following relationships may be satisfied:

In case of Q=0, $$V_{FT}=(C_2 \cdot V_T+C_4 \cdot V_D)/C_T \quad (3)$$

In case of Q=ΔQ, $$V_{FT}=(C_2 \cdot V_T'+C_4 \cdot V_D+\Delta Q)/C_T \quad (4)$$

Since the threshold voltage of the transistor, as viewed from the floating gate, is constant irrespective of the amount of electron charges Q, $$V_{FT}=V_{FT}.$$

As a consequence, it is given by subtracting equation (3) from equation (4) as follows:

$$C_2(V_t'-C_T)/C_T=Q/C_T \quad (5)$$

Accordingly, if $Vr-Vr'=\Delta Vr$, then it is given as follows:

$$C_2 \cdot \Delta V_T= -\Delta Q \quad (6)$$

On the other hand, when $V_{CG}$ is increased only by a very small value to become $(V_{CG}+\Delta V_{CG})$, since Q also becomes $(Q+\Delta Q)$, the above-described equation (2) is expressed as follows:

$$V_{FG}+\Delta V_{FG}=\{C_2(V_{CG}+\Delta V_{CG})+C_4 \cdot V_D+(Q+\Delta Q)\}/C_T \quad (7)$$

Accordingly, it is given by subtracting equation (2) from equation (7) as follows:

$$\Delta V_{FG}=(C_2 \cdot \Delta V_{CG}+\Delta Q)/C_T \quad (8)$$

When equation (6) is substituted for equation (8), it becomes as follows:

$$\Delta V_{FG}=C_2(\Delta V_{CG}-\Delta V_T)/C_T \quad (9)$$

It should be noted that after a time period required to injecting electron charges into the floating gate has sufficiently elapsed, it becomes $$\Delta V_{FG}=0$$

As a consequence, it becomes as follows:

$$\Delta V_{CG}=\Delta V_T \quad (10)$$

As a consequence, it may be recognized that the threshold voltage after the writing operation is varied by the voltages applied to the control gate.

We claim:

1. A non-volatile semiconductor memory device capable of selectively storing one of at least three different data comprising:

a memory array including a plurality of memory cells, each of said memory cells having a control gate, a floating gate, a drain, and a source;

means for producing a stepped voltage whose level is varied stepwise to a number of different levels corresponding to a number of said different data;

means for producing a pulse voltage having a predetermined voltage level and a predetermined pulse width;

means for selecting one of said plurality of memory cells; and means for applying, during storing of said at least three different data, said stepped voltage and said pulse voltage to said control gate and said drain of said selected memory cell, respectively, while controlling a timing of application of said pulse voltage to said drain relative to a timing of application of said stepped voltage to said control gate, depending on which of said at least three different data is to be stored into said selected memory cell.

2. A non-volatile semiconductor memory device as claimed in claim 1, wherein said pulse width of the pulse voltage is not longer than a shortest one of duration times of the respective levels of said stepped voltage.

3. A non-volatile semiconductor memory device as claimed in claim 1, wherein said at least three different data as stored in each memory cell correspond to at least three different levels of a threshold voltage of each memory cell, and the different levels of said stepped voltage are determined based on said different levels of the threshold voltage.

4. A non-volatile semiconductor memory device as claimed in claim 1, wherein said means for controlling an application timing controls the timing of application of said stepped voltage to said control gate and the timing of application of said pulse voltage to said drain so that said pulse voltage is applied to said control gate, when the stepped voltage applied to control gate is at a level corresponding to one of said at least three data to be stored into said selected memory cell.

5. A non-volatile semiconductor memory device as claimed in claim 1, wherein the number of said different data is $2^n$ (n being a positive integer and $n \geq 2$), and said stepped voltage has $2^n$ different levels.

6. A non-volatile semiconductor memory device capable of selectively storing one of at least three different data, comprising:

a memory array including a plurality of memory cells, each of said memory cells having a control gate, a floating gate, a drain, and source;

selecting means for selecting one of said plurality of memory cells;

switching means for switching operations of said non-volatile semiconductor storage device between a write mode to write one of said different data into said selected memory cell and a read mode to read out data stored in said selected memory cell;

stepped voltage producing means for producing a first stepped voltage whose level is varied stepwise to a number of different levels corresponding to a number of data to be stored, when said write mode is set by said switching means, and for producing a second stepped voltage whose level is varied stepwise to a number of different levels corresponding to the number of data to be stored, when said read mode is set by said switching means;

pulse voltage producing means for producing a first pulse voltage having a predetermined voltage level and a predetermined first pulse width when said write mode is set, and for producing a second pulse voltage having a constant voltage and a predetermined second pulse width when said read mode is set;

timing control means for applying said first stepped voltage and said first pulse voltage to said control gate and said drain of said selected memory cell, respectively, when said write mode is set, while controlling a timing of application of said pulse voltage to said drain relative to a timing of application of said stepped voltage to said control gate corresponding to a value of data to be stored in said selected memory cell, and for applying said second stepped voltage and said second pulse voltage to said control gate and said drain of said selected memory cell respectively, when said read mode is set, while controlling a timing of application of said second pulse voltage to said drain relative to a timing of application of said second stepped voltage to said control gate in such a manner that at least said second pulse voltage is applied to said drain while said second stepped voltage is applied to said control gate; and detecting means for detecting a current flowing through a drain-to-source circuit of said selected memory cell at each of the levels of said second stepped voltage applied to said control gate when said read mode is set.

7. A non-volatile semiconductor memory device as claimed in claim 6, wherein the pulse width of said first pulse voltage is not longer than a shortest one of duration times of the respective voltage levels of said first stepped voltage.

8. A method of selectively writing one of at least three different data into a non-volatile semiconductor memory device comprising a memory array including a plurality of memory cells, each of said memory cells having a control gate, a floating gate, a drain, and a source, said method comprising the steps of:

selecting one of said plurality of memory cells;

producing a stepped voltage whose level is varied stepwise to a number of different levels corresponding to a number of said different data, and applying said stepped voltage to the control gate of said selected memory cell at a time of writing of one of said at least three different data into said selected memory cell;

producing a pulse voltage having a predetermined voltage level and a predetermined pulse width and applying said pulse voltage to the drain of said selected memory cell; and controlling a timing of application of said pulse voltage to said drain relative to a timing of application of said stepped voltage to said control gate depending on which of said at least three different data is to be stored into said selected memory cell.

9. A method as claimed in claim 8, wherein said pulse width of the pulse voltage is not longer than a shortest one of duration times of the respective levels of said stepped voltage.

10. A method as claimed in claim 8, wherein said at least three different data correspond to different levels of a threshold voltage to be set to each of said memory cells.

11. A method as claimed in claim 10, wherein the different levels of said stepped voltage are determined based upon the different levels of the threshold voltage to be set to each of said memory cells.

12. A method as claimed in claim 8, wherein the number of said different data to be stored is $2^n$ (n being a positive integer and $n \geq 2$), and said stepped voltage has $2^n$ different levels.

13. A method of reading one of at least three different data written into a non-volatile semiconductor memory device comprising a memory array including a plurality of memory cells, each having a control gate, a floating gate, a drain, and a source, said method comprising the steps of:

selecting one of said plurality of memory cells to be read;

producing a stepped voltage whose level is varied stepwise to a number of different levels corresponding to a number of said different data, and applying said stepped voltage to the control gate of said selected memory cell;

producing a pulse voltage having a constant voltage and a predetermined pulse width, and applying said pulse voltage to the drain of said selected memory cell;

providing a plurality of reference cells, each having the same structure and electrical characteristic as those of the memory cell;

detecting a drain-to-source current of said selected memory cell at each of the levels of said stepped voltage applied to the control gate of said selected memory cell; and comparing the detected drain-to-source current of said selected memory cell with drain-to-source currents of the respective reference cells in sequence thereby determining the data written in said selected memory cell.

* * * * *